US011394355B2

(12) United States Patent
    Kawasoe (10) Patent No.: US 11,394,355 B2
(45) Date of Patent: Jul. 19, 2022

(54) SEMICONDUCTOR DEVICE (71) Applicant: LAPIS Semiconductor Co., Ltd., Yokohama (JP)

(72) Inventor: Suguru Kawasoe, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 23 days.

(21) Appl. No.: 16/940,805

(22) Filed: Jul. 28, 2020

(65) Prior Publication Data

US 2021/0036667 A1 Feb. 4, 2021

(30) Foreign Application Priority Data

Jul. 30, 2019 (JP) .............................. JP2019-140068
Mar. 31, 2020 (JP) .............................. JP2020-063932

(51) Int. Cl.

| H03F 3/217 | (2006.01) |
|---|---|
| H03F 1/52 | (2006.01) |
| H03F 3/185 | (2006.01) |
| H04R 3/00 | (2006.01) |
| H03F 3/38 | (2006.01) |

(52) U.S. Cl.
CPC ............... *H03F 3/217* (2013.01); *H03F 1/52* (2013.01); *H03F 3/185* (2013.01); *H04R 3/00* (2013.01); *H03F 2200/03* (2013.01)

(58) Field of Classification Search
CPC . H03F 3/217; H03F 1/52; H03F 3/185; H03F 2200/03; H03F 2200/351; H03F 1/523; H03F 3/345; H03F 3/2173; H04R 3/00; H04R 3/007; H04R 29/001
USPC ....................................... 330/10, 207 A, 251
See application file for complete search history.

(56) References Cited

U.S. PATENT DOCUMENTS

| 9,413,312 B2 * | 8/2016 | Jiang ....................... H02M 1/32 |
| 10,256,777 B2 * | 4/2019 | Cope ....................... H03F 3/187 |
| 10,877,087 B1 * | 12/2020 | Joharapurkar ........... H04R 3/00 |

FOREIGN PATENT DOCUMENTS

JP          2007-235526 A        9/2007

* cited by examiner

*Primary Examiner* — Hieu P Nguyen
(74) *Attorney, Agent, or Firm* — Rabin & Berdo, P.C.

(57) ABSTRACT

A semiconductor device includes: a first buffer at which a predetermined signal is input and that outputs a first output signal; a second buffer at which an inverted signal of the predetermined signal is input and that outputs a second output signal; and a short circuit detection circuit that, in accordance with a potential difference between the first output signal and the second output signal, outputs a short circuit evaluation signal evaluating whether or not there is a ground fault in at least one of a first terminal at an output side of the first buffer or a second terminal at an output side of the second buffer or evaluating whether or not there is a short circuit between the first terminal and the second terminal.

2 Claims, 8 Drawing Sheets

SEMICONDUCTOR DEVICE 1 0 0

SEMICONDUCTOR DEVICE 200

RELATED ART

SEMICONDUCTOR DEVICE 300

FIG. 8

RELATED ART

SEMICONDUCTOR DEVICE

CROSS-REFERENCE TO RELATED APPLICATION

This application is based on and claims priority under 35 USC 119 from Japanese Patent Application No. 2019-140068 filed on Jul. 30, 2019 and Japanese Patent Application No. 2020-63932 filed on Mar. 31, 2020, the disclosure of which are incorporated by reference herein.

BACKGROUND

Technical Field

The present disclosure relates to a semiconductor device equipped with a function for outputting audio signals, and particularly relates to a protection circuit that protects the semiconductor device at a time of a short circuit at an audio output terminal.

Related Art

Among semiconductor devices, semiconductor devices that are connected to speakers and output audio signals are commonly known. In these semiconductor devices, class-D amplifiers, which are more efficient and generate less heat than class-AB amplifiers and the like, are widely used in fields such as consumer goods, vehicle equipment and so forth.

A buffer for driving a low-impedance speaker that is employed in a semiconductor device that outputs audio signals has a current-driving capability several times or tens of times greater than a general-purpose I/O buffer or such to be used in a microcomputer or the like. Therefore, when a ground fault or a short circuit between terminals occurs, a large current is generated, causing a failure of the semiconductor device. Accordingly, a protection circuit that protects the semiconductor device when a ground fault or a short circuit between terminals occurs is employed. For example, in FIG. 5 of Japanese Patent Application Laid-Open (JP-A) No. 2007-235526, a protection circuit is proposed that: compares output signals from two output terminals; when a state in which the output signals operate in phase continues for more than a predetermined duration, judges that a short circuit has occurred; and, by turning off an output circuit, prevents overloading of a speaker or the like or destruction of an amplifier.

However, in the protection circuit described above, depending on circumstances, the detection circuit may perform an erroneous detection. Alternatively, depending on circumstances, this protection circuit may fail to detect a short circuit between terminals or a ground fault. Therefore, this protection circuit is a restricted circuit that can only be used when output resistance or load resistance specifications are restricted.

Using a comparator to evaluate a short circuit between terminals can be considered. However, providing a comparator has the disadvantage of increasing circuit size, leading to higher costs.

SUMMARY

A semiconductor device according to an aspect of the present disclosure includes: a first buffer at which a predetermined signal is input and that outputs a first output signal; a second buffer at which an inverted signal of the predetermined signal is input and that outputs a second output signal; and a short circuit detection circuit that, in accordance with a potential difference between the first output signal and the second output signal, outputs a short circuit evaluation signal evaluating whether or not there is a ground fault in at least one of a first terminal at an output side of the first buffer or a second terminal at an output side of the second buffer or evaluating whether or not there is a short circuit between the first terminal and the second terminal.

BRIEF DESCRIPTION OF DRAWINGS

Exemplary embodiments will be described in detail based on the following figures, wherein.

DETAILED DESCRIPTION

Figure 7:
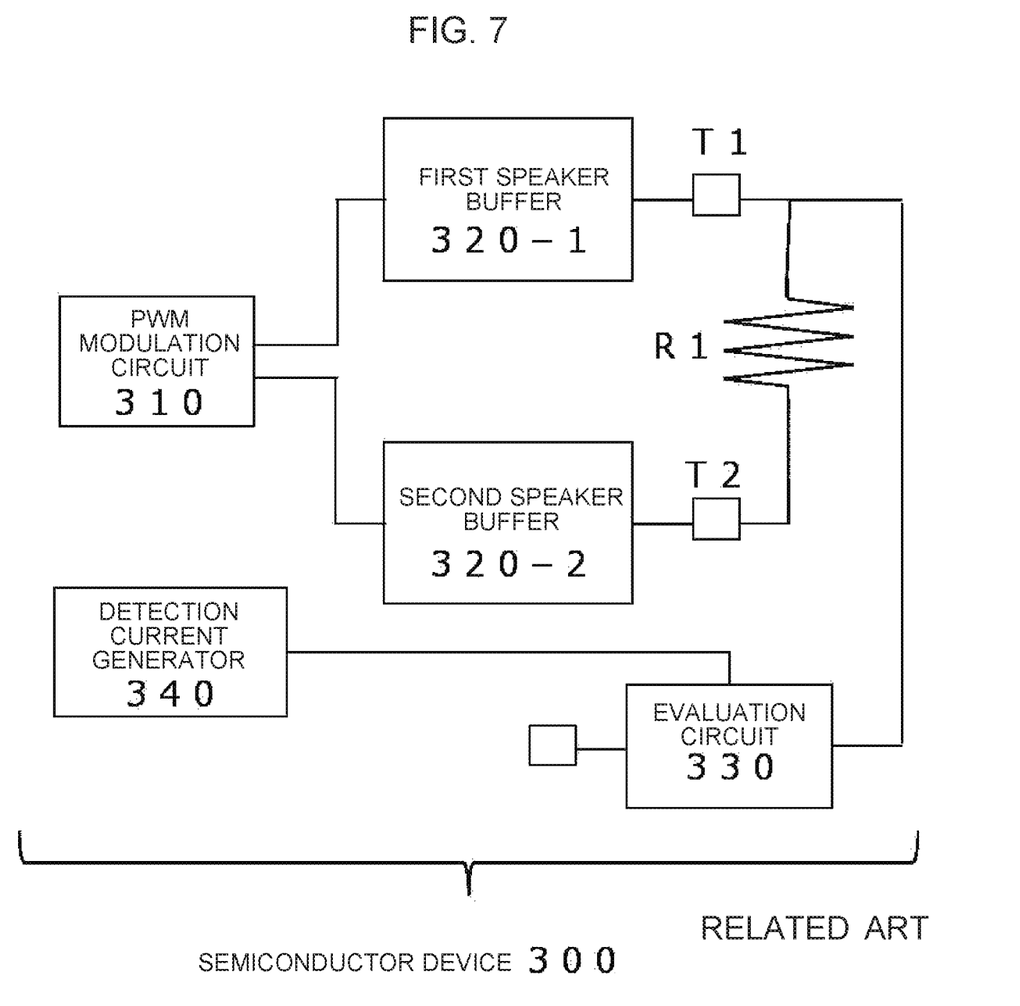
FIG. 7 is a block diagram showing structures of a semiconductor device according to a comparative example.
Figure 8:
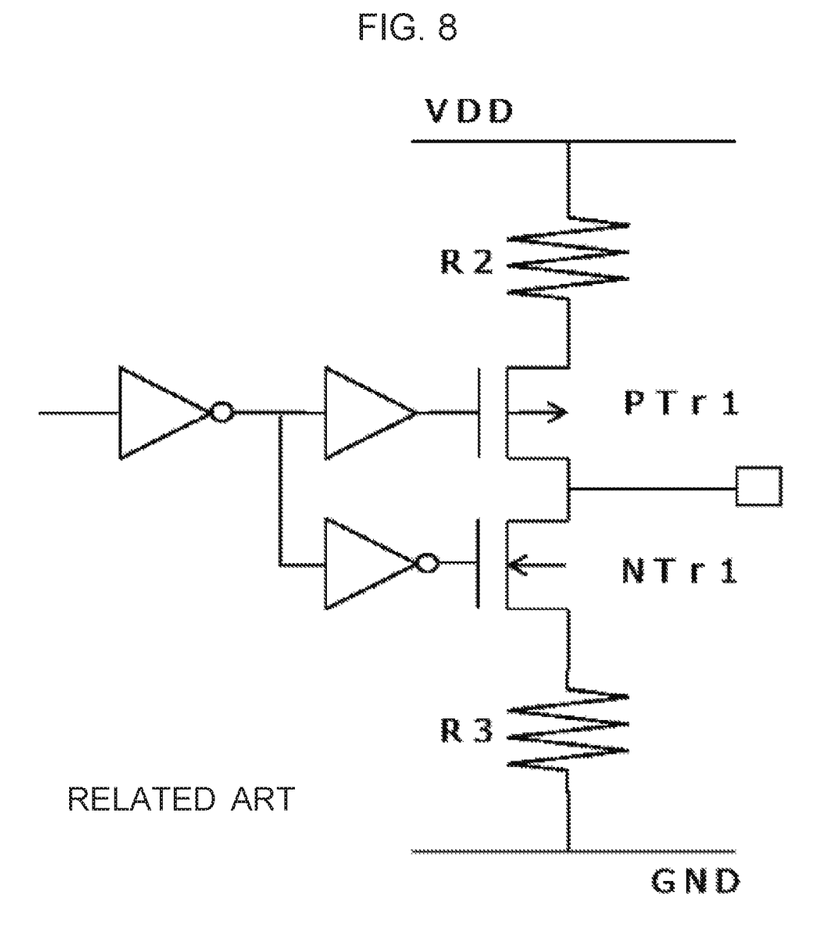
FIG. 8 is a circuit diagram of a speaker buffer.

FIG. 7 shows structures of a semiconductor device 300 that serves as a comparative example. The semiconductor device 300 is structured by a pulse width modulation (PWM) modulation circuit 310, a first speaker buffer 320-1, a second speaker buffer 320-2, an evaluation circuit 330, and a detection current generator 340. The semiconductor device 300 detects a voltage drop caused by an over-current. For example, the evaluation circuit 330, which is configured with a NOR circuit, detects an abnormality when a voltage according to voltage levels of a terminal T1 and a terminal T2 drops. The first speaker buffer 320-1 is provided with the configuration of a class-D amplifier as illustrated in FIG. 8. A PMOS transistor PTr1 is a first output transistor of the first speaker buffer 320-1 and an NMOS transistor NTr1 is a second output transistor of the first speaker buffer 320-1. The voltage level of terminal T1 is determined by on resistances of the PMOS transistor PTr1 and NMOS transistor NTr1, internal power supply wiring resistances R2 and R3, and a load resistance R1 of an external speaker. The voltage level of terminal T2 is similar.

A specified value of a detection current outputted from the detection current generator 340 is determined from the speaker output power specifications. Common speaker output power specifications are a power supply voltage of 5 V, output 1 W, and load resistance RL=8Ω or thereabouts. Given these specifications, taking account of irregularities in the speaker and power supply, Vt skew (variations in threshold voltage) of the transistors and the like, a maximum output current is around 800 mA (5.6 V, RL=6Ω). A current value higher than this would be caused by a short circuit between terminals or a ground fault. Therefore, a threshold for evaluating when the voltage levels of terminal T1 and terminal T2 have dropped is set in design on the basis of this maximum output current.

However, the voltage levels of terminal T1 and terminal T2 at a time of a short circuit between terminals T1 and T2 or a ground fault vary greatly due to the speaker wiring resistances R2 and R3 and the speaker load resistance R1, but adjusting the threshold of the evaluation circuit 330 is difficult. Consequently, erroneous detection of a short circuit between terminals or a ground fault may occur.

For example, if the speaker is operating with a power supply voltage of 5 V and an audio output of 1 W, and the terminal T1 is a high output, the output voltage is around 4 V. Usual operations in these conditions must continue without the evaluation circuit 330 detecting an abnormality. Because terminal T1 and terminal T2 are continuously at high and low outputs, the evaluation circuit 330 may judge that there is an error during usual operations: a constant period error is detected by sampling when the output is high.

In these circumstances, if the speaker load resistance R1 is large in a customer use environment, or the load resistance RL is small, a likely voltage at the terminal T1 is continuously below 4 V. Consequently, the evaluation circuit 330 may erroneously detect a voltage drop. Further, if a wiring resistance at the GND line side is very large, the voltage may be at a voltage value above a threshold of the evaluation circuit, which may then fail to detect a short circuit between terminals or a ground fault. Therefore, this is a restricted circuit that can only be used when output resistance ROUT or load resistance RL specifications are restricted.

In order to solve this problem, instead of evaluation with a NOR circuit, comparing a reference voltage with the voltage of terminal T1 at a comparator can be considered. However, providing a comparator has the disadvantage of increasing circuit size, leading to higher costs. Further, in the technology proposed in JP-A No. 2007-235526, the outputs from two output terminals are compared at a NOR circuit; only a short circuit between terminals is evaluated. Thus, failure causes that can be evaluated are limited. In addition, similarly to the above, the size of the circuit is increased.

Below, examples of embodiments of the present disclosure are described with reference to the drawings. In the drawings, the same reference symbols are assigned to elements and portions that are the same or equivalent. Proportional dimensions in the drawings are exaggerated to facilitate understanding and may be different from actual proportions.

First Exemplary Embodiment

Below, a semiconductor device according to a first exemplary embodiment of the present disclosure is described using FIG. 1 to FIG. 4.

Figure 1:
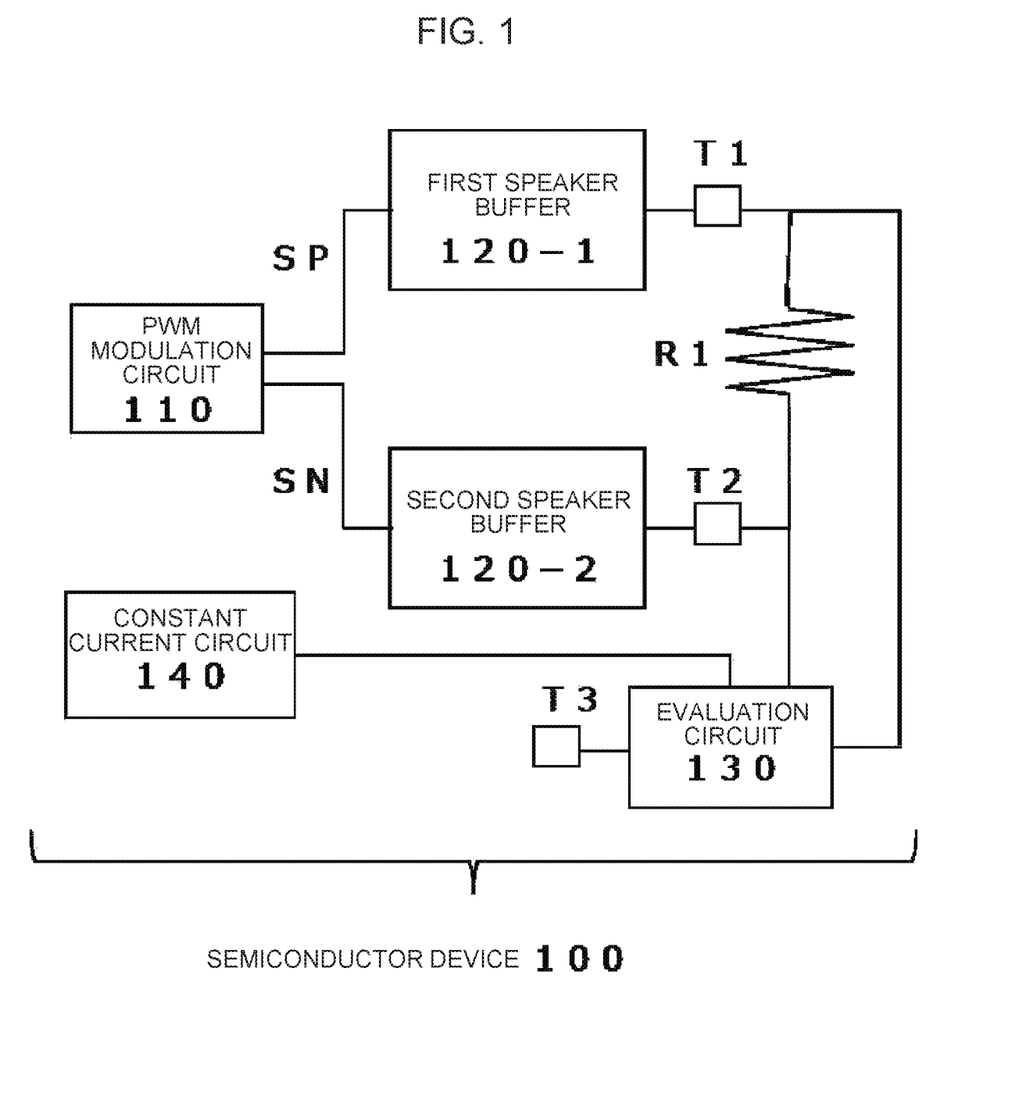
FIG. 1 is a block diagram showing structures of a semiconductor device according to a first exemplary embodiment of the present disclosure.

As shown in FIG. 1, a semiconductor device 100 according to the present exemplary embodiment includes: a PWM modulation circuit 110; a first speaker buffer 120-1 at which output signals SP from the PWM modulation circuit 110 are inputted; a second speaker buffer 120-2 at which inverted signals SN of the output signals SP from the PWM modulation circuit 110 are inputted; an evaluation circuit 130 that evaluates a short circuit between a terminal T1 at the output side of the first speaker buffer 120-1 and a terminal T2 at the output side of the second speaker buffer 120-2, or a ground fault of the terminals T1 and T2, and outputs short circuit evaluation signals from a terminal T3; and a constant current circuit 140 that provides current to the evaluation circuit 130. The output signals SP from the PWM modulation circuit 110 and inverted signals SN of the output signals SP are, for example, audio signals.

Figure 2:
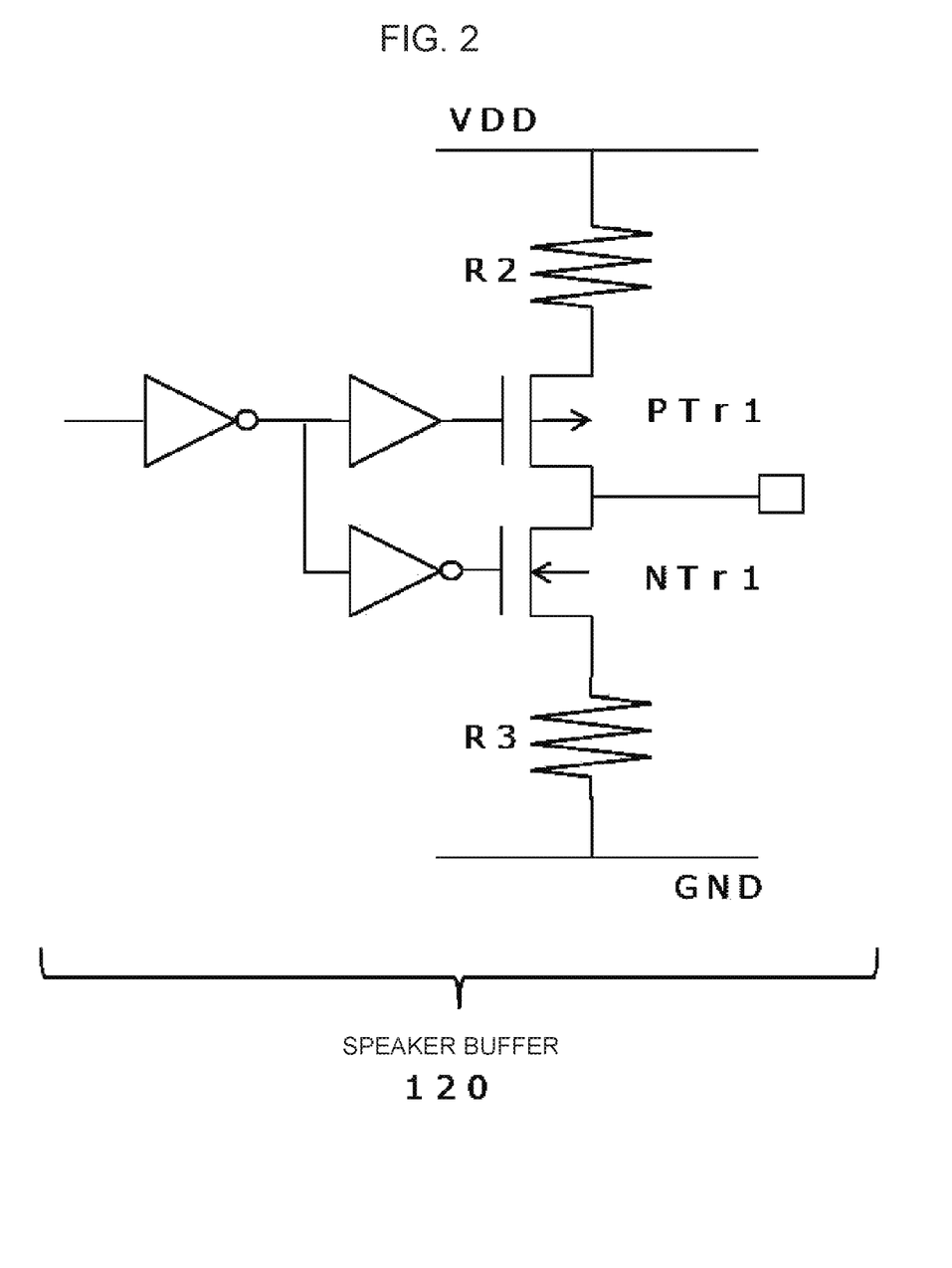
FIG. 2 is a circuit diagram of a speaker buffer.

A circuit diagram of each speaker buffer 120 is depicted in FIG. 2. The speaker buffer 120 receives signals from the PWM modulation circuit 110, and output transistors PTr1 and NTr1 output buffer output signals from complementary operation by a combination of logic circuits. The resistance R2 and the resistance R3 represent respective power supply wiring resistances between VDD and GND. The first speaker buffer 120-1 and second speaker buffer 120-2 shown in FIG. 1 each include the same circuit structure as the speaker buffer 120 in FIG. 2.

Figure 3:
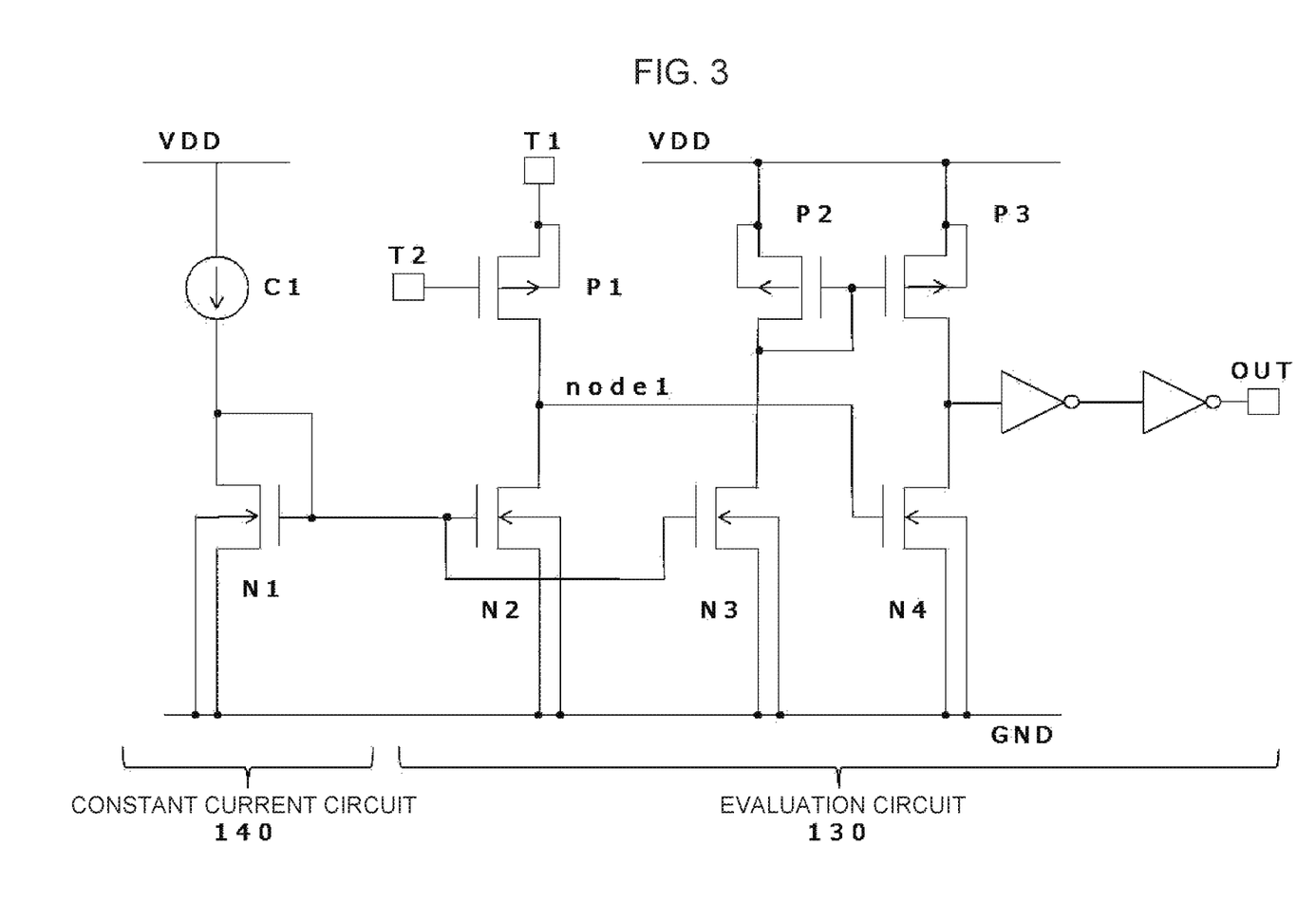
FIG. 3 is a circuit diagram of an evaluation circuit and a constant current circuit according to the first exemplary embodiment.

FIG. 3 shows a circuit diagram of the evaluation circuit 130 and the constant current circuit 140. The evaluation circuit 130 is configured with a PMOS transistor P1 and NMOS transistor N2 that serve as a short circuit detection circuit, and with PMOS transistors P2 and P3 and NMOS transistors N3 and N4 that serve as a level shifter. The PMOS transistor P1 is an example of a potential difference detection section. The constant current circuit 140 is configured with a constant current source C1 and an NMOS transistor N1. The short circuit detection circuit of the evaluation circuit 130 is configured by the PMOS transistor P1, whose source is connected to terminal T1 and gate is connected to terminal T2, and the NMOS transistor N2, which supplies a constant current to the PMOS transistor P1. An output node 1 of the short circuit detection circuit is connected to the gate of the NMOS transistor N4 of the level shifter. The drain of the NMOS transistor N4 is connected to the drain of the PMOS transistor P3, which is connected to configure a current mirror circuit from the constant current circuit 140. Short circuit evaluation signals are outputted from a terminal OUT of the evaluation circuit 130. The short circuit evaluation signals are signals evaluating whether or not there is a ground fault of terminal T1 or terminal T2 and whether or not there is a short circuit between terminal T1 and terminal T2.

The constant current circuit 140 does not necessarily have to be a circuit that is set up to provide current for the short circuit detection circuit. This circuit may connect a current provided by another circuit in the semiconductor device such as, for example, a constant voltage regulator (LDO) or the like to configure a current mirror circuit for each of the short circuit detection circuit and the level shifter. A circuit that is employed as another constant current source may also be used as the constant current circuit 140; thus, an increase in size of the circuitry may be suppressed.

Figure 4:
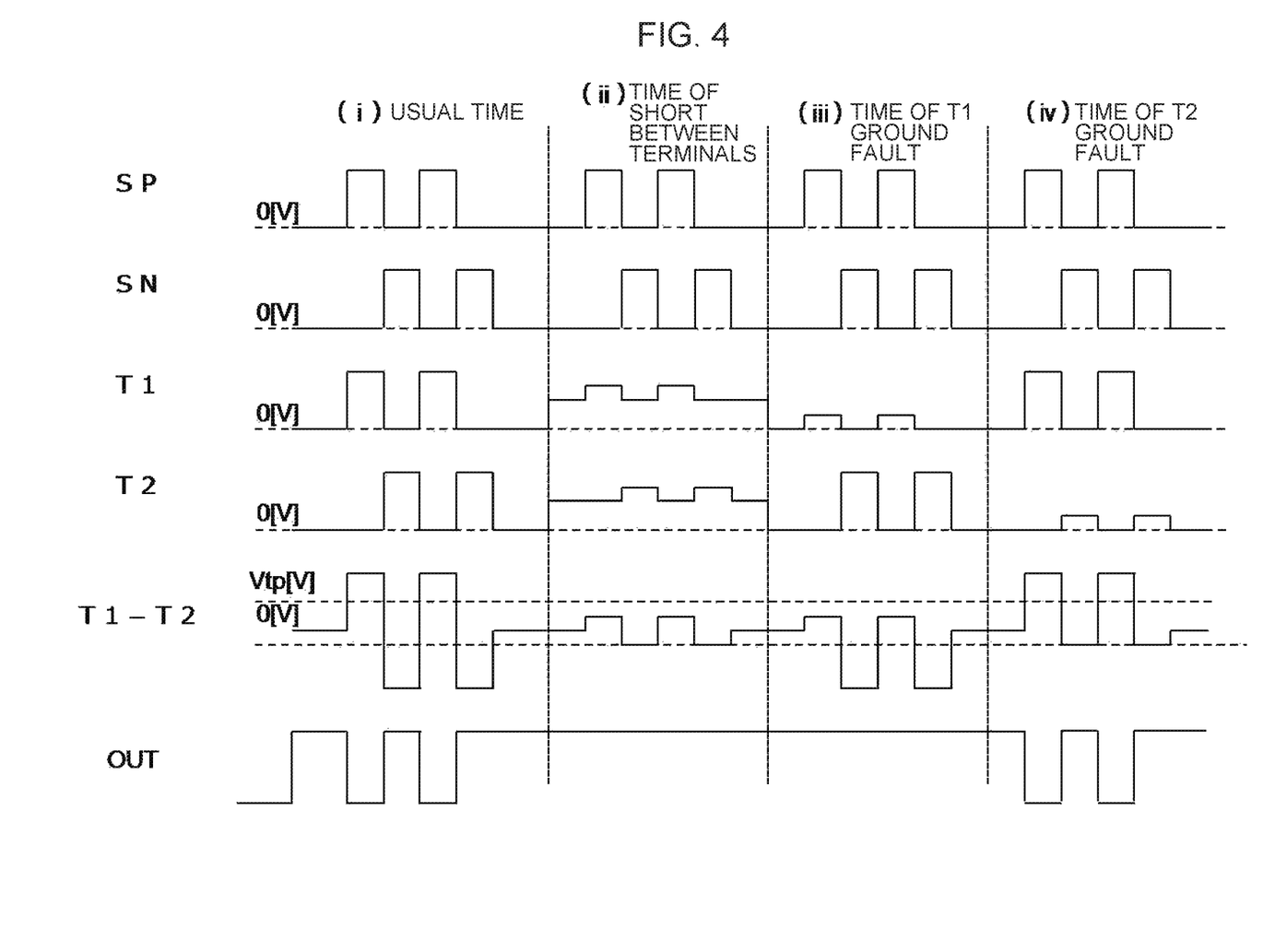
FIG. 4 is a timing chart showing operations of the semiconductor device according to the first exemplary embodiment.

FIG. 4 is a timing chart describing operations of the semiconductor device 100 according to the first exemplary embodiment. Time (i) represents a usual time, illustrating a situation in which terminal T1 and terminal T2 are connected with an 8Ω speaker, which is a usual operation of the circuit shown in FIG. 3. If a wiring resistance of the speaker is assumed to be 0.1Ω and the on resistance of each buffer is assumed to be 0.5Ω, then if VDD=5 V, the voltage at terminal T1 is around 4.67 V and the voltage at terminal T2 is around 0.33 V. Thus, the PMOS transistor P1 is turned on. Because the PMOS transistor P1 is turned on, the gate potential of the succeeding NMOS transistor N4 is the same as the potential of terminal T1. Therefore, at a usual time, the short circuit evaluation signals outputted from terminal OUT are low.

At time (ii), representing a time of a short circuit between terminals, a situation in which terminal T1 and terminal T2 are short-circuited is illustrated. When terminal T1 and terminal T2 are short-circuited, terminal T1 and terminal T2 may simply be regarded as being connected by 0Ω. Thus, the potential difference between the gate and source of the PMOS transistor P1 is 0 V. Therefore, at the time of the short circuit between terminals, the PMOS transistor P1 turns off and 0 V is applied to the gate of the succeeding NMOS transistor N4. As a result, the short circuit evaluation signals outputted from terminal OUT are high. Because the short circuit evaluation signals outputted from terminal OUT are high, a speaker short-circuit state is detected.

At time (iii), representing a time of a ground fault of terminal T1, a situation in which terminal T1 is short-circuited to GND is illustrated. When terminal T1 is short-circuited to a GND terminal, the source terminal of the PMOS transistor P1 is continuously at 0 V. Thus, regardless of the voltage at terminal T2, 0 V is continuously applied to the gate of the NMOS transistor N4. As a result, the short circuit evaluation signals outputted from terminal OUT are high. Because the short circuit evaluation signals outputted from terminal OUT are high, a speaker short-circuit state is detected.

In contrast, at time (iv), representing a time of a ground fault of terminal T2, a situation in which terminal T2 is short-circuited to GND may not be detected. The reason for this is that the evaluation circuit 130 detects a short circuit of terminals T1 and T2 from on/off switching caused by the potential difference between the gate and source of the PMOS transistor P1. At the time of a ground fault of terminal T2, there is a potential difference between terminal T1 and terminal T2, and the short circuit detection signals outputted by terminal OUT are low. To avoid the situation in which terminal T2 being short-circuited to ground may not be detected, it is sufficient to provide the evaluation circuit 130 with another short circuit detection circuit, and provide substitutes for terminal T1 and T2 connecting to the gate and source of the PMOS transistor P1. When a separate short circuit detection circuit is provided, a ground fault of terminal T2 may be detected. That is, two short circuit detection circuits may be provided in the evaluation circuit 130 and, by checking of outputs from both the short circuit detection circuits, short circuits between terminal T1 and terminal T2 and respective ground faults may be avoided.

According to the first exemplary embodiment as described above, a short circuit between terminals of terminal T1 and terminal T2 or a ground fault of terminal T1 may be detected by the PMOS transistor P1 provided in the evaluation circuit 130. In the detection method described for the comparative example or the like, at a time of a short circuit, an output voltage of the speaker may not change enough to exceed a threshold voltage of a NOR circuit, depending on the wiring resistance of a speaker or on resistance of a speaker buffer, and the short circuit may not be detected. In contrast, in the first exemplary embodiment of the present disclosure, because the voltage difference between terminal T1 and terminal T2 is detected directly by the PMOS transistor P1, a short circuit state may definitely be detected. Because the PMOS transistor P1 is connected to terminal T1 and terminal T2, the PMOS transistor P1 may be formed with a different size from an alternative transistor. The PMOS transistor P1 may be made larger than an alternative transistor in order to raise the withstand voltage. Alternatively, because detection signals are smaller in an energy-efficient speaker or the like, the PMOS transistor P1 may be formed with a structure smaller than an alternative transistor. In addition, the evaluation circuit 130 according to the first exemplary embodiment achieves detection of a short circuit between terminals of terminal T1 and terminal T2 or of a ground fault of terminal T1 with a simple structure, without employing a comparator or a reference voltage. Therefore, the evaluation circuit 130 may have little effect on chip size, and consequently a low-cost semiconductor device may be provided.

Second Exemplary Embodiment

Below, a semiconductor device according to a second exemplary embodiment of the present disclosure is described using FIG. 5 and FIG. 6.

Figure 5:
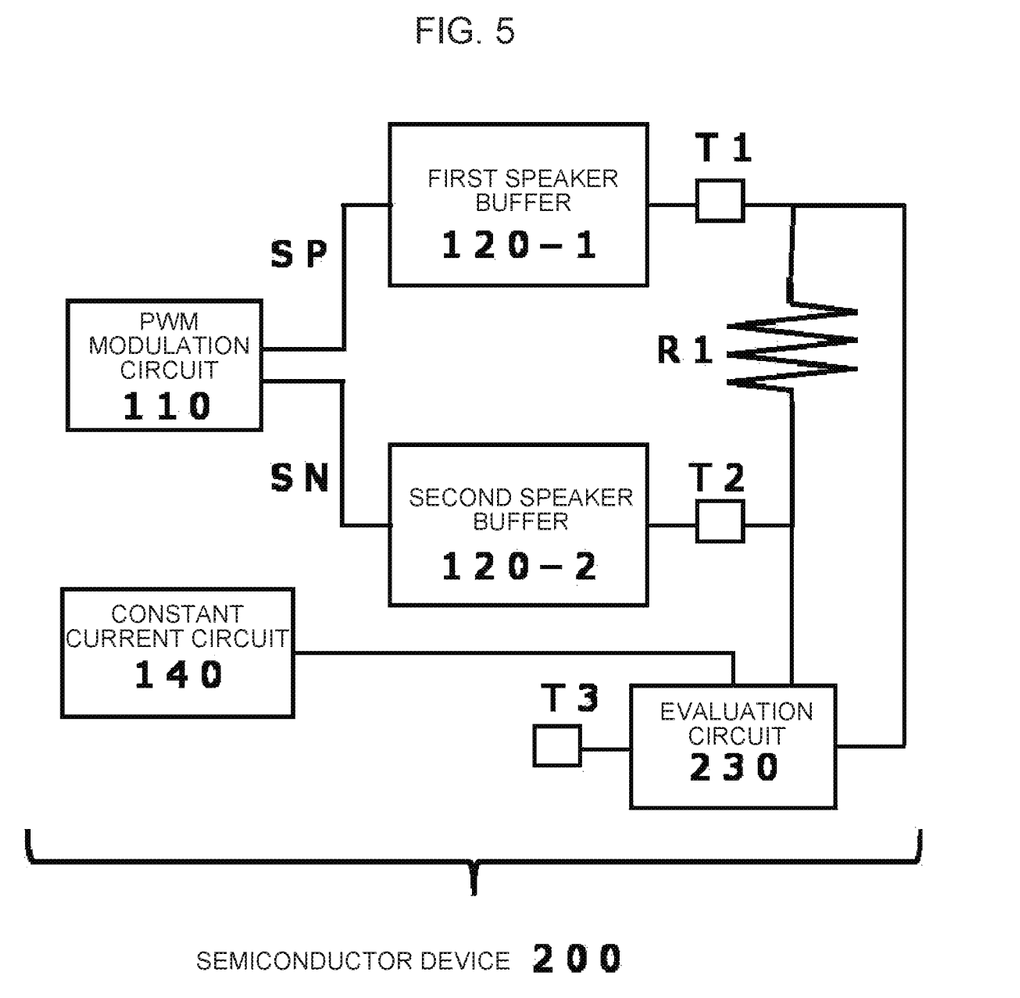
FIG. 5 is a block diagram showing structures of a semiconductor device according to a second exemplary embodiment of the present disclosure.

As shown in FIG. 5, a semiconductor device 200 according to the second exemplary embodiment of the present disclosure includes: the PWM modulation circuit 110; the first speaker buffer 120-1 at which the output signals SP from the PWM modulation circuit 110 are inputted; the second speaker buffer 120-2 at which the inverted signals SN of the output signals SP from the PWM modulation circuit 110 are inputted; an evaluation circuit 230 that evaluates a short circuit between terminals T1 and terminal T2 or a ground fault of terminals T1 and T2; and the constant current circuit 140 that provides current to the evaluation circuit 230. Structures assigned the same reference symbols as in the first exemplary embodiment are similar to the first exemplary embodiment, and accordingly are not described in detail here.

Figure 6:
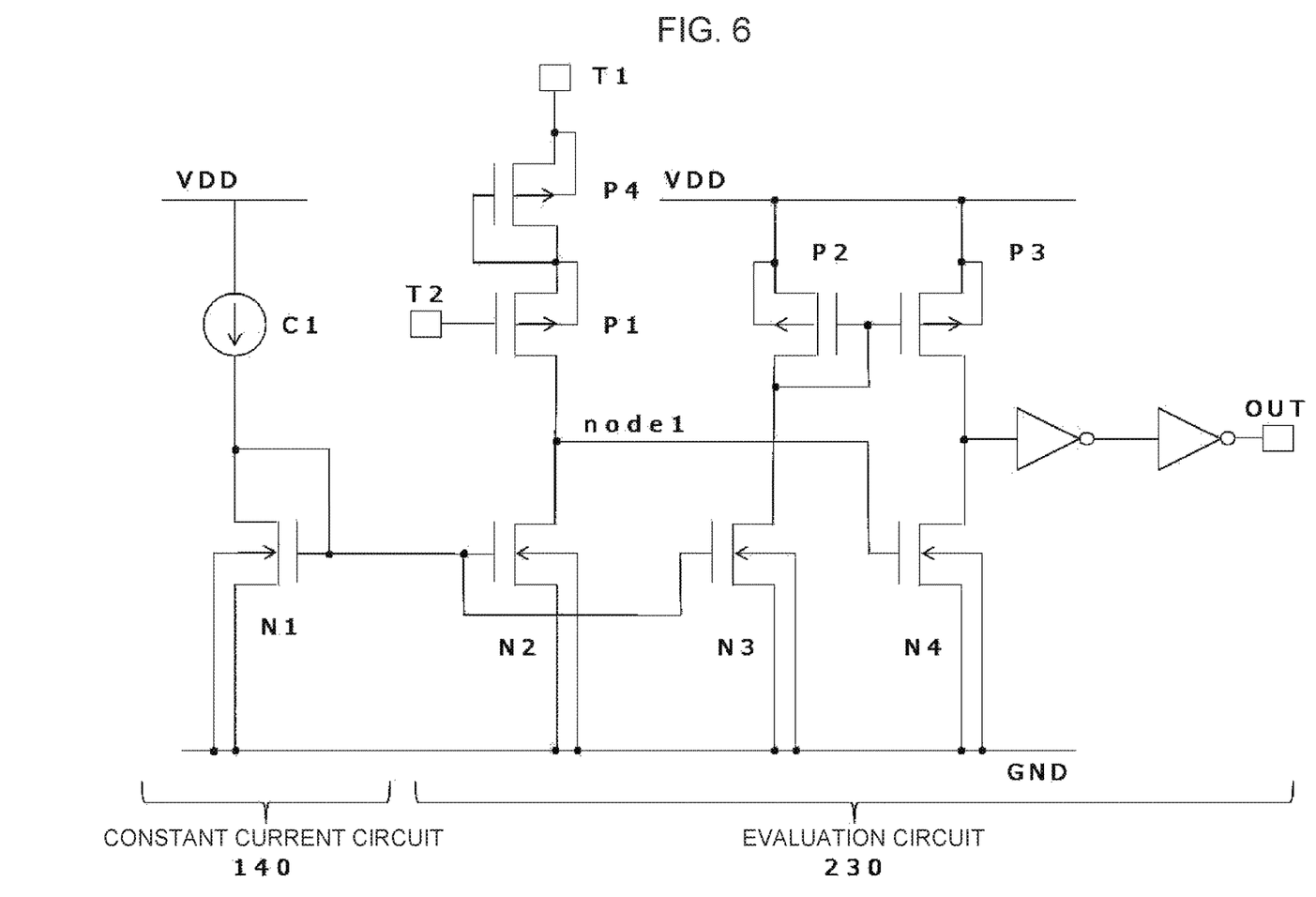
FIG. 6 is a circuit diagram of an evaluation circuit and a constant current circuit according to the second exemplary embodiment.

FIG. 6 shows the evaluation circuit 230 and the constant current circuit 140. The evaluation circuit 230 differs from the evaluation circuit 130 according to the first exemplary embodiment in that a PMOS transistor employed in the short circuit detection circuit is formed with a two-stage structure.

The evaluation circuit 230 according to the second exemplary embodiment is configured with PMOS transistors P1 and P4 and the NMOS transistor N2 that serve as a short circuit detection circuit, and with the PMOS transistors P2 and P3 and NMOS transistors N3 and N4 that serve as a level shifter. Basic operations are similar to the first exemplary embodiment, but a resistance value detecting a short circuit between terminals is different. Similarly to the first exemplary embodiment, the wiring resistance of the speaker is taken to be 0.1Ω and the on resistance of each speaker buffer 0.5Ω. A threshold voltage Vtp of the PMOS transistor P1 is 1 V. A resistance value at which the PMOS transistor P1 according to the first embodiment turns on, that is, the resistance value R1 for evaluating a short circuit between terminals, is calculated as follows.

$$\text{Terminal } T1 \text{ (V)} - \text{Terminal } T2 \text{ (V)} = Vtp \text{ (V)} \quad (1)$$

If a resistance value of the PMOS transistor PTr1 of each speaker buffer is represented as RPTr1, and a resistance value of the NMOS transistor NTr1 is represented as RNTr1, then when the power supply voltage is 5 V, the relationship in the following expression (2) applies.

$$(R1+RNTr1+R3)/(R2+RPTr1+RNTr1+R3)\times 5 - (RNTr1+R3)/(R2+RPTr1+RNTr1+R3)\times 5 = Vtp = 1 \quad (2)$$

When expression (2) is solved, the resistance value R1 for evaluating a short circuit is 0.3Ω.

When the resistance value R1 for evaluating a short circuit between terminals is 0.3Ω, because a large margin relative to the speaker impedance of 8Ω is assured, there is no risk of erroneous detection. When there is a short circuit with the power supply voltage at 5 V and the resistance value of the example described above, a current flowing in the semiconductor device is approximately 3.3 A. To raise sensitivity to a short circuit in order to avoid a failure of the semiconductor device, that is, to raise the detection resistance value, it is sufficient to add the PMOS transistor P4 as illustrated in the second exemplary embodiment. If the threshold voltage Vtp of the PMOS transistor P4 is the same as the PMOS transistor P1 at 1 V, and the power supply voltage is 5 V, the relationship in the following expression (3) applies.

$$(R1+RNTr1+R3)/(R2+RPTr1+RNTr1+R3)\times 5 - (RNTr1+R3)/(R2+RPTr1+RNTr1+R3)\times 5 = Vtp \times 2 = 2 \quad (3)$$

When expression (3) is solved, the resistance value R1 for evaluating a short circuit is 0.8Ω. When there is a short circuit with the power supply voltage at 5 V and the resistance value of the example described above, a current flowing in the semiconductor device 200 is approximately 2.5 A. Thus, by the addition of the PMOS transistor P4 to the evaluation circuit 230, the semiconductor device 200 may lower the resistance value for detecting a short circuit and raise the sensitivity of short circuit detection. However, there is a limit on the number of PMOS transistor levels that can be layered; that is, on the number of PMOS transistors that can be linked in series between terminal T1 and terminal T2. This is because, if a total number of layered PMOS transistors is represented by n, the voltage applied to the gate of the succeeding NMOS transistor N4 when the PMOS transistor P1 is turned on is T1−n×Vtp (V). Thus, beyond the limit, the NMOS transistor N4 does not turn on.

According to the second exemplary embodiment of the present disclosure as described above, because the number of PMOS transistor stages in the short circuit detection circuit of the evaluation circuit 230 is increased, the resistance value for detecting a short circuit may be raised. According to the second exemplary embodiment, the sensitivity of short circuit detection may be adjusted by raising the resistance value for detecting a short circuit.

An object of the present disclosure is to provide a semiconductor device equipped with a short circuit detection circuit with low cost and high detection accuracy, without causing an increase in circuit size.

A semiconductor device according to a first aspect of the present disclosure includes: a first buffer at which a predetermined signal is input and that outputs a first output signal; a second buffer at which an inverted signal of the predetermined signal is input and that outputs a second output signal; and a short circuit detection circuit that, in accordance with a potential difference between the first output signal and the second output signal, outputs a short circuit evaluation signal evaluating whether or not there is a ground fault in at least one of a first terminal at an output side of the first buffer or a second terminal at an output side of the second buffer or evaluating whether or not there is a short circuit between the first terminal and the second terminal.

In a semiconductor device according to a second aspect of the present disclosure, in the semiconductor device according to the first aspect, the short circuit detection circuit includes: a potential difference detection section that detects a potential difference between the first output signal and the second output signal; and a signal output section that outputs the short circuit evaluation signal in accordance with the detection by the potential difference detection section.

In a semiconductor device according to a third aspect of the present disclosure, in the semiconductor device according to the second aspect, the potential difference detection section includes a first transistor that switches between on and off in accordance with the potential difference between the first output signal and the second output signal.

In a semiconductor device according to a fourth aspect of the present disclosure, in the semiconductor device according to the third aspect: the potential difference detection section further includes a second transistor connected in series with the first transistor, the second transistor switching between on and off in accordance with the potential difference between the first output signal and the second output signal.

In a semiconductor device according to a fifth aspect of the present disclosure, in the semiconductor device according to any one of the first to fourth aspects, the predetermined signal is an audio signal.

According to the present disclosure, a semiconductor device equipped with a short circuit detection circuit with low cost and high detection accuracy may be provided without causing an increase in circuit size.

What is claimed is:

1. A semiconductor device comprising:
   a first buffer at which a predetermined signal is input and that outputs a first output signal;
   a second buffer at which an inverted signal of the predetermined signal is input and that outputs a second output signal; and
   a short circuit detection circuit that, in accordance with a potential difference between the first output signal and the second output signal, outputs a short circuit evaluation signal evaluating whether or not there is a ground fault in at least one of a first terminal at an output side of the first buffer or a second terminal at an output side of the second buffer or evaluating whether or not there is a short circuit between the first terminal and the second terminal,
   wherein the short circuit detection circuit includes,
   a potential difference detection circuit that detects a potential difference between the first output signal and the second output signal; and
   a signal output circuit that outputs the short circuit evaluation signal in accordance with the detection by the potential difference detection circuit, and wherein
   the potential difference detection circuit includes a first transistor that switches between on and off in accordance with the potential difference between the first output signal and the second output signal; and
   a second transistor connected in series with the first transistor, the second transistor switching between on and off in accordance with the potential difference between the first output signal and the second output signal.

2. The semiconductor device according to claim 1, wherein the predetermined signal is an audio signal.

* * * * *